(12) United States Patent
Sotozaki et al.

(10) Patent No.: US 6,643,882 B1
(45) Date of Patent: Nov. 11, 2003

(54) SUBSTRATE CLEANING APPARATUS

(75) Inventors: Hiroshi Sotozaki, Kanagawa-ken (JP); Koji Atoh, Kanagawa-ken (JP); Yuki Inoue, Kanagawa-ken (JP); Tatsuo Inoue, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 334 days.

(21) Appl. No.: 09/594,787

(22) Filed: Jun. 16, 2000

(30) Foreign Application Priority Data

Jun. 17, 1999 (JP) .......................................... 11-171223

(51) Int. Cl.[7] .............................................. B08B 1/04
(52) U.S. Cl. ............................ 15/77; 15/88.2; 15/88.3; 15/102; 451/65
(58) Field of Search .................... 15/77, 88.2, 88.3, 15/102; 451/65

(56) References Cited

U.S. PATENT DOCUMENTS

| | | | |
|---|---|---|---|
| 4,935,981 A | * 6/1990 | Ohtani et al. | 15/88.2 |
| 5,282,289 A | * 2/1994 | Hasegawa et al. | 15/88.2 X |
| 5,351,360 A | * 10/1994 | Suzuki et al. | 15/77 X |
| 5,485,644 A | * 1/1996 | Shinbara et al. | 15/88.2 X |
| 5,547,415 A | * 8/1996 | Hasegawa et al. | 451/44 |
| 5,868,866 A | 2/1999 | Maekawa et al. | 134/34 |
| 6,059,891 A | * 5/2000 | Kubota et al. | 15/77 X |
| 6,158,075 A | * 12/2000 | Tanaka et al. | 15/102 |
| 6,286,525 B1 | * 9/2001 | Nishimura et al. | 15/88.2 X |
| 6,292,972 B1 | * 9/2001 | Ishihara et al. | 15/77 |

FOREIGN PATENT DOCUMENTS

| | | |
|---|---|---|
| JP | 8-238463 | 9/1996 |
| JP | 10-308370 | 11/1998 |

OTHER PUBLICATIONS

A full computer tanslation of Japanese Patent Application Public Disclosure No. 10–308370.

* cited by examiner

*Primary Examiner*—Mark Spisich
(74) *Attorney, Agent, or Firm*—Wenderoth, Lind & Ponack, L.L.P.

(57) ABSTRACT

A substrate cleaning apparatus for cleaning a rotating substrate has a scrub cleaning tool for cleaning the substrate by bringing the cleaning tool into contact with the substrate, a liquid jet spray nozzle for cleaning the substrate by yet-spraying a cleaning liquid from the nozzle to the substrate, and a swing mechanism for simultaneously swinging both of the scrub cleaning tool and the liquid jet spray nozzle on and above the substrate. The substrate cleaning apparatus also has a cleaning tool vertical driving mechanism for moving at least the cleaning tool from a position where the cleaning tool is in contact with a surface of the substrate to another position where the cleaning liquid jet-sprayed from the nozzle is applied to the cleaning tool, by vertically moving the cleaning tool.

20 Claims, 13 Drawing Sheets

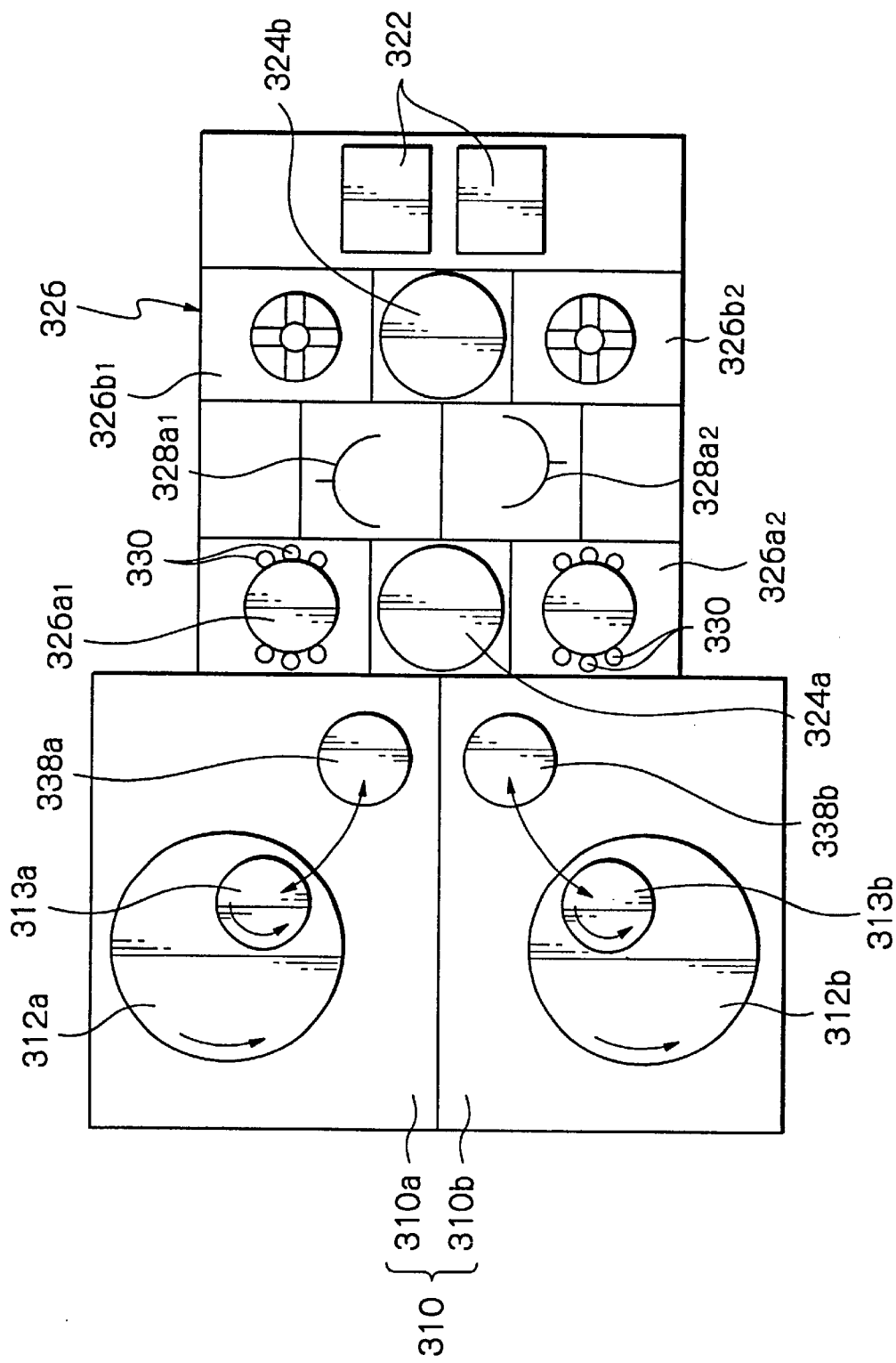

SUBSTRATE CLEANING APPARATUS

BACKGROUND OF THE INVENTION

The present invention relates to a substrate cleaning apparatus used for cleaning a substrate to be cleaned, such as a semiconductor wafer, a LCD or the like.

In this type of conventional substrate cleaning apparatus mentioned above, for example, such a configuration has been provided, which comprises a scrub cleaning tool for cleaning a wafer by rubbing a surface to thereof with a brush or a sponge (cleaning tool), and a liquid jet spray nozzle for cleaning the wafer by jet-spraying high pressure water excited by ultrasonic vibration energy or cavitation onto the surface of the wafer, or the like. Each of these cleaning means are mounted on an individual arm, respectively, to be moved by a respective swinging arm between a center and a periphery of the wafer while rotating the wafer to clean the entire surface of the wafer.

A reason why a plurality of cleaning means are combined to clean the wafer is discussed below. That is, it is true that a cleaning method for cleaning the wafer by rubbing the surface thereof with a sponge made of PVA (polyvinyl-alcohol) can efficiently remove submicron-sized dust. However, such dust is absorbed into or attached to the PVA sponge, and as a result, when a certain amount of dust has been stored in the sponge, further cleaning effect cannot be expected and it possibly causes a problem of so-called "reverse contamination".

On the other hand, another cleaning method for cleaning the wafer by jet-spraying high pressure water energized by ultrasonic wave or cavitation is effective on cleaning a rather clean wafer having several tens to several hundreds of dust particles attached on the surface thereof. This method is also effective on cleaning extremely contaminated wafer having several hundred thousands of initial dust particles, such as a semiconductor wafer just after CMP (chemical mechanical polishing) processing, which has been put to practical use as a planarization technology of multilayer wiring of the semiconductor device. This are because, different from the method using a brush or the sponge, there is no fear of reverse contamination and thereby, a dust level on the wafer can be certainly lowered. When both of the sponge and the ultrasonic wave are used simultaneously, dust which cannot be removed by either of them individually may be removed by the synergistic effect thereof.

Thus, the wafer can be effectively cleaned by properly selecting or changing the cleaning means depending on a contaminated condition thereof. For example, when an extremely contaminated wafer is cleaned after CMP processing as described above, it needs to be cleaned-at first by the liquid jet spray nozzle, then by the scrub cleaning tool, and finally again by the liquid jet spray nozzle. It is needless to say that other combinations may be employed.

In a case where a plurality of cleaning means are used to clean a single wafer as described above, when the wafer is being cleaned using one cleaning means, other cleaning means shall be retracted into their retracted positions in order to prevent a possible interference between the arms on which respective cleaning means are mounted. Thus, there are problems of longer cleaning period, worse processing efficiency, and rather complicated mechanism and control because of use of the two arms.

In the scrub cleaning tool described above, a self-cleaning operation is necessary to remove dust attached to the brush or the sponge, and accordingly an additional container js required to reserve pure water for the self-cleaning, which requires additional space and brings negative effect on compactness of the apparatus.

In the conventional apparatus, an exclusive mechanism for cleaning a periphery of the wafer is provided to remove dust attached to the periphery of the wafer, which makes both the apparatus and the control complicated.

SUMMARY OF THE INVENTION

In view of the above-mentioned situation, the present invention has been made, and an object thereof Is to provide a substrate cleaning apparatus comprising both of a scrub cleaning tool and a liquid jet spray nozzle, which allows either of the cleaning tool and the liquid jet spray nozzle or both of them simultaneously to be selected at need, and provides a shorter cleaning time period, an improved processing efficiency and simplified structure and control.

Another object of the present invention is to provide a substrate cleaning apparatus which requires no additional equipment for self-cleaning.

Yet another object of the present invention is to provide a substrate cleaning apparatus which requires no additional equipment for cleaning a periphery or side surface of a substrate.

Still yet another object of the present invention is to provide a polishing apparatus incorporating the substrate cleaning apparatus described above.

In order to solve the problems described above, the present invention provides a substrate cleaning apparatus for cleaning a rotating substrate, the substrate cleaning apparatus comprising a scrub cleaning tool for cleaning the substrate by bringing the cleaning tool into contact with the substrate, a liquid jet spray nozzle for cleaning the substrate by jet-spraying a cleaning liquid from the nozzle to the substrate, a swing mechanism for simultaneously swinging both of the scrub cleaning tool and the liquid jet spray nozzle on and above the substrate, and a cleaning tool vertical driving mechanism for moving at least the cleaning tool from a position where the cleaning tool is in contact with a surface of the substrate to another position where the cleaning liquid jet-sprayed from the nozzle is applied to the cleaning tool, by vertically moving the cleaning tool independent of the liquid jet spray nozzle.

The present invention further provides another substrate cleaning apparatus for cleaning a rotating substrate, the substrate cleaning apparatus comprising a scrub cleaning tool for cleaning the substrate by bringing the cleaning tool into contact with the substrate, a swing mechanism for swinging the scrub cleaning tool on the substrate, and a cleaning tool vertical driving mechanism for moving at least the cleaning tool from a position where the cleaning tool is in contact with a surface of the substrate to another position where the cleaning tool is in contact with a side surface of the substrate, by vertically moving the cleaning tool.

The present invention further provides yet another substrate cleaning apparatus for cleaning a rotating substrate, the substrate cleaning apparatus comprising scrub cleaning tool for cleaning the substrate by bringing the cleaning tool into contact with the substrate a liquid jet spray nozzle for cleaning the substrate by jet-spraying a cleaning liquid from the nozzle to the substrate, a swing mechanism for simultaneously swinging both of the scrub cleaning tool and the liquid jet spray nozzle on and above the substrate, a cleaning tool vertical driving mechanism for vertically moving the cleaning tool, and a nozzle vertical driving mechanism for vertically moving the nozzle.

The present invention further provides a polishing apparatus comprising a polishing machine for polishing a substrate by bringing a surface of the substrate to be polished into contact with a polishing surface of a polishing tool, and a cleaning machine for cleaning the substrate after the substrate has been polished by the polishing machine, the polishing apparatus characterized in that any one of the substrate cleaning apparatus described above is employed as the cleaning machine.

BRIEF DESCRIPTION OF THE DRAWINGS

FIGS. 1(a) and (b) are schematic diagrams of a substrate cleaning apparatus according to a first embodiment of the present invention, wherein FIG. 1(a) is a schematic side elevational view and FIG. 1(b) is a schematic plan view thereof;

FIG. 15 is an overall schematic plan view illustrating an example of an arrangement of a polishing apparatus to which the present invention is applied.

DETAILED DESCRIPTION OF THE INVENTION

There will now be described preferred embodiments of the present invention with reference to the attached drawings.

Figure 1A:
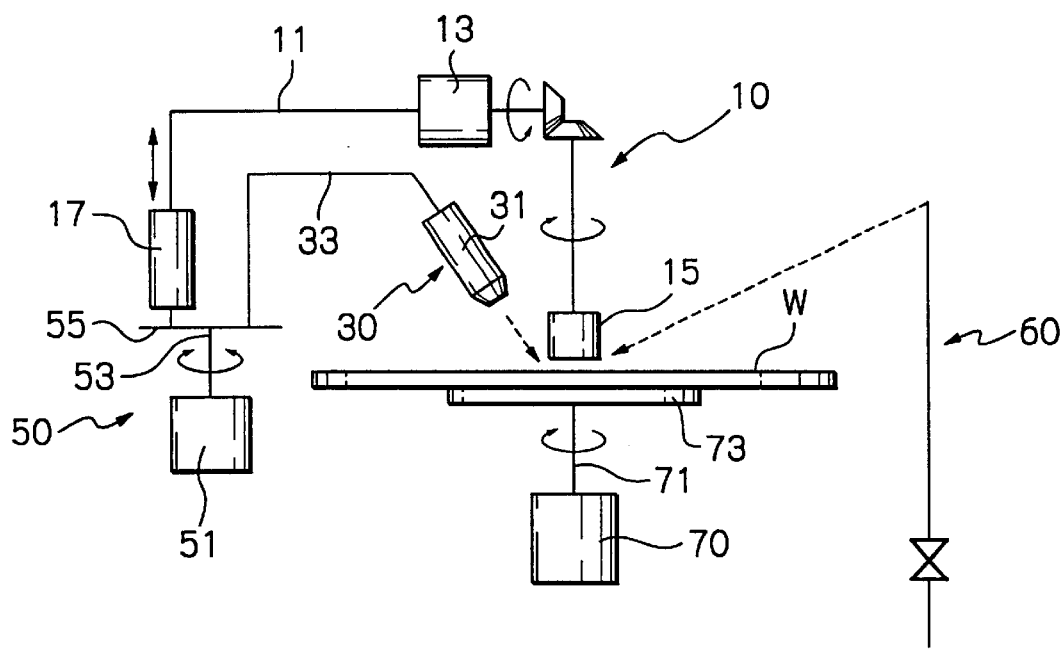
Figure 1B:
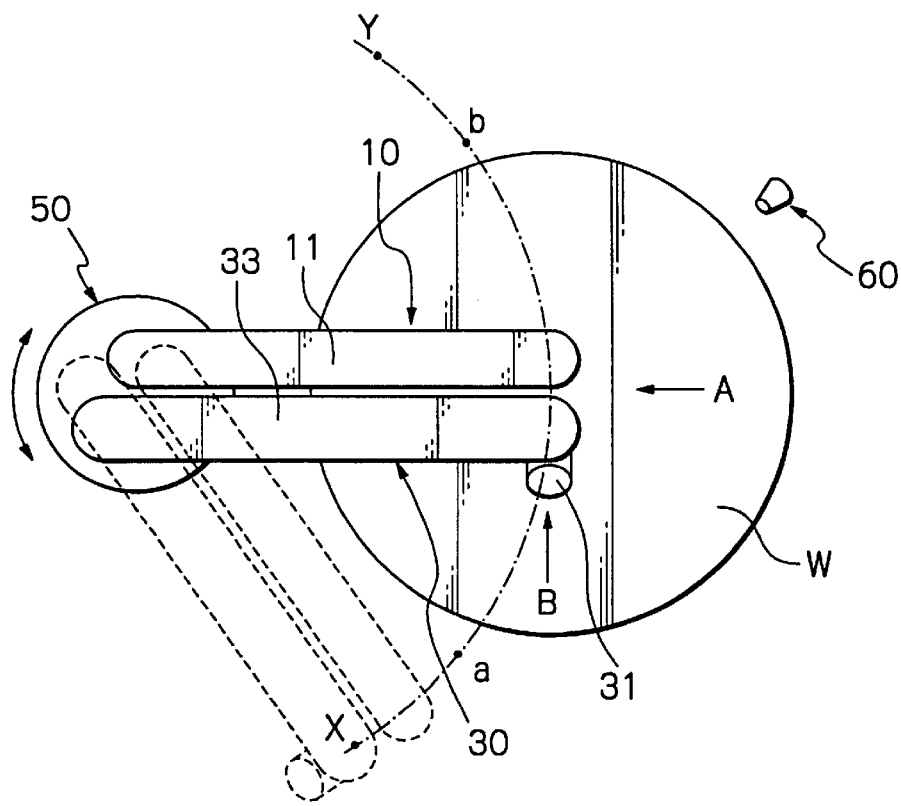

FIGS. 1(a) and (b) are schematic diagrams of a substrate cleaning apparatus according to a first embodiment of the present invention, wherein FIG. 1(a) is a schematic side elevational view and FIG. 1(b) is a schematic plan view thereof. As shown in FIGS. 1(a) and 1(b), the substrate cleaning apparatus comprises a scrub cleaning tool 10 and a liquid jet spray nozzle 30 as a cleaning means, and further a swing mechanism 50 for swinging both of the scrub cleaning tool 10 and the liquid jet spray nozzle 30 simultaneously on and above a wafer W.

The scrub cleaning tool 10 includes an arm 11, one end of which is attached to a swing board 55 of the swinging mechanism 50 through a cleaning tool vertical driving mechanism 17, and to the other end of which is attached a sponge (cleaning tool) 15 which is made of PVA and is rotatively driven by a sponge rotating motor 13.

Figure 7A:
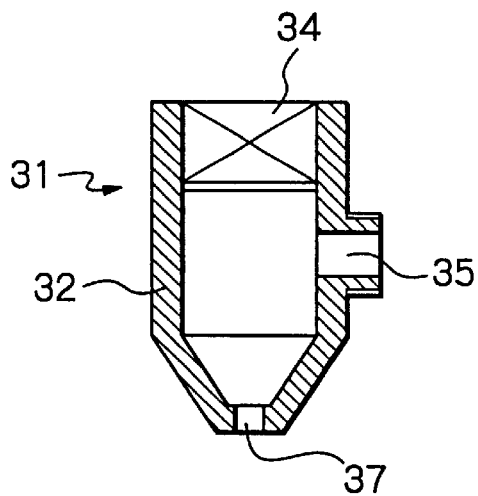
FIGS. 7(a) and 7(b) are sectional views showing examples of an internal structure of the nozzle for a liquid jet spray cleaning.

On the other hand, the liquid jet spray cleaning nozzle 30 includes an arm 33, one end of which is attached to the swing board 55 of the swinging mechanism 50, and to the other end of which, at a proximity of a tip thereof, is attached a nozzle 31 for a liquid jet spray cleaning. In the nozzle 31 of this embodiment an ultrasonic cleaning nozzle is employed for jet-spraying a liquid energized by ultrasonic wave. Specifically, an ultrasonic vibrator 34 is disposed in a nozzle body 32 as shown in FIG. 7(a), and a liquid (ultrapure water) is introduced through an inlet port 35 while actuating the ultrasonic vibrator 34, with the energized liquid being jet-sprayed through a spray port 37.

Referring again to FIG. 1, in the swinging mechanism 50, the swing board 55 is fixed to a swing shaft 53 of a swing motor 51. On the other hand, the semiconductor wafer W is vacuum-chucked on a rear surface thereof by a vacuum chuck mechanism 73 attached to a drive shaft 71 of a servo motor 70. Reference numeral 60 designates a rinse supply means.

In FIG. 1(b), a chain line shows a locus of movement of the sponge 15 of the scrub cleaning tool 10 and the nozzle 31 of the liquid jet spray nozzle 30, and dotted lines show a retracted position of the arms 11 and 33.

Figure 2A:
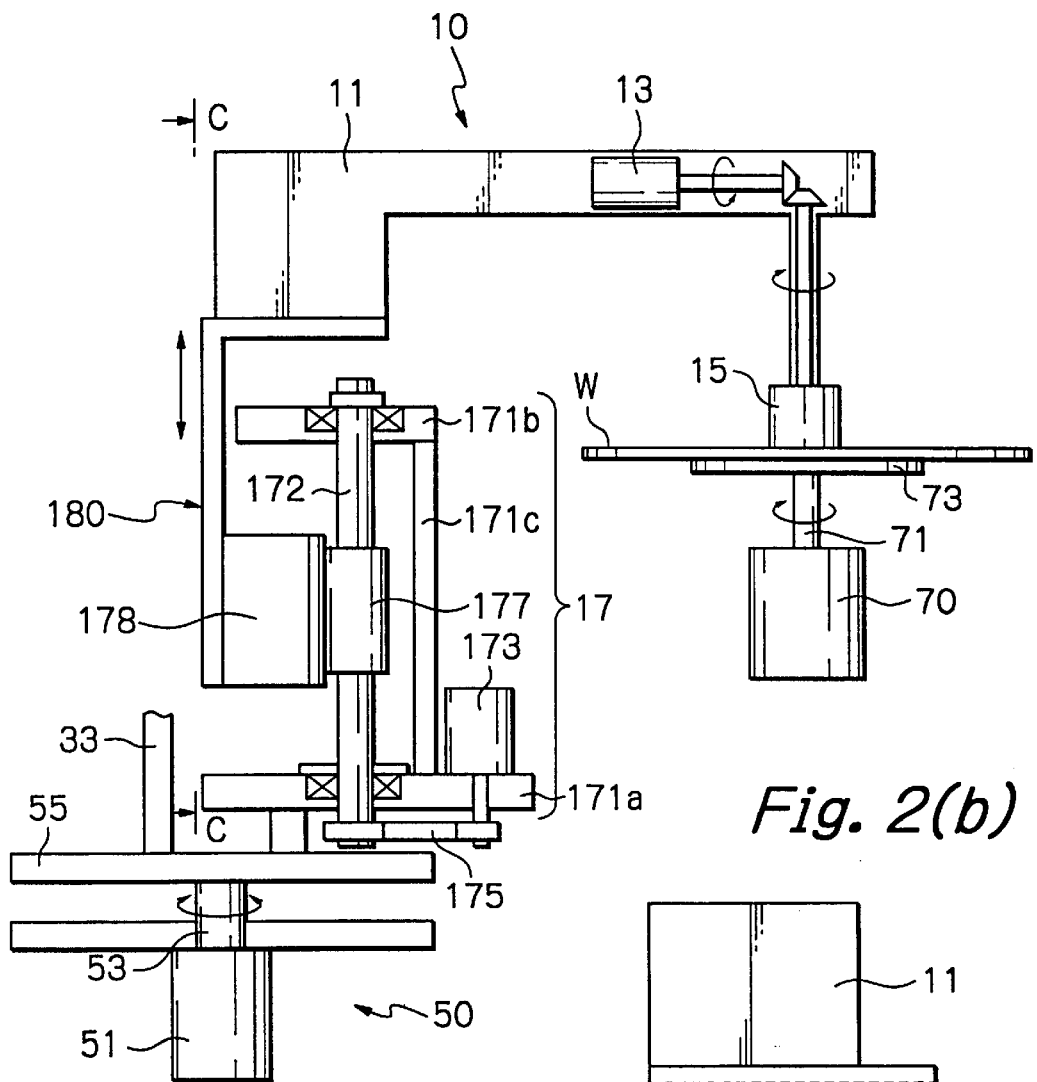
FIG. 2(a) is an overall schematic side elevational view illustrating a specific example of a mechanism of a scrub cleaning tool.
Figure 2B:
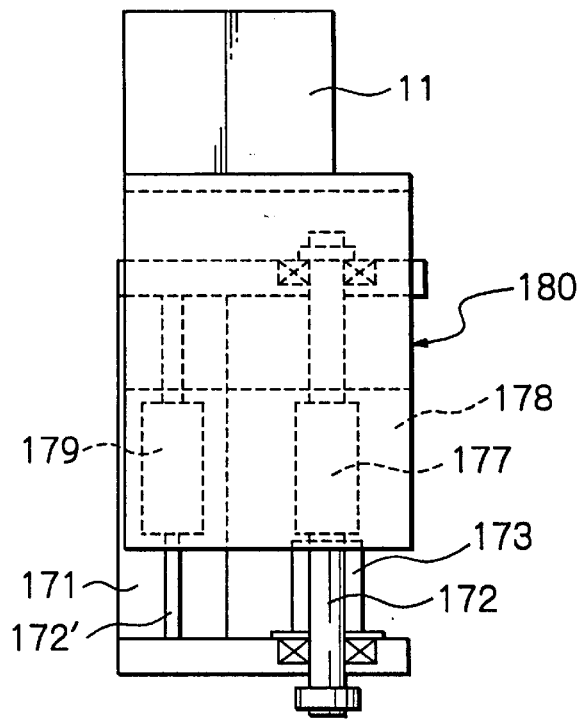
FIG. 2(b) is a view taken on line C—C of FIG. 2(a)

FIGS. 2(a) and (b) show a specific example of a mechanism of the scrub cleaning tool 10, wherein FIG. 2(a) is an overall schematic side elevational view thereof and FIG. 2(b) is a view taken on line C—C of FIG. 2(a). As shown in FIGS. 2(a) and 2(b), in the cleaning tool vertical driving mechanism 17, upper and lower ends of a rotary shaft 172 for a ball screw are rotatably supported by a frame 171 (171a–171c). A belt 175 is stretched between a lower end of the rotary shaft 172 and an arm vertical driving motor 173 attached to a lower portion 171a of the frame 171, and a ball screw 177 is mounted on the rotary shaft 172, and the arm 11 is fixedly attached to the ball screw 177 through a back plate 180 and a bracket 178. Behind the ball screw 177, on a far side thereof on the drawing 2(a)(left in FIG. 2(b)), a LM guide 179 is fixed to the bracket 178 so that the LM guide 179 is slidably guided along a guide shaft 172' disposed parallel with the rotary shaft 172(in FIG. 2(a), LM guide 179 is not shown since it is overlapped and hidden by the ball screw 177). The arm 11 can be moved vertically by actuating the arm vertical driving motor 173 and thereby rotatively driving the rotary shaft 172.

Figure 3:
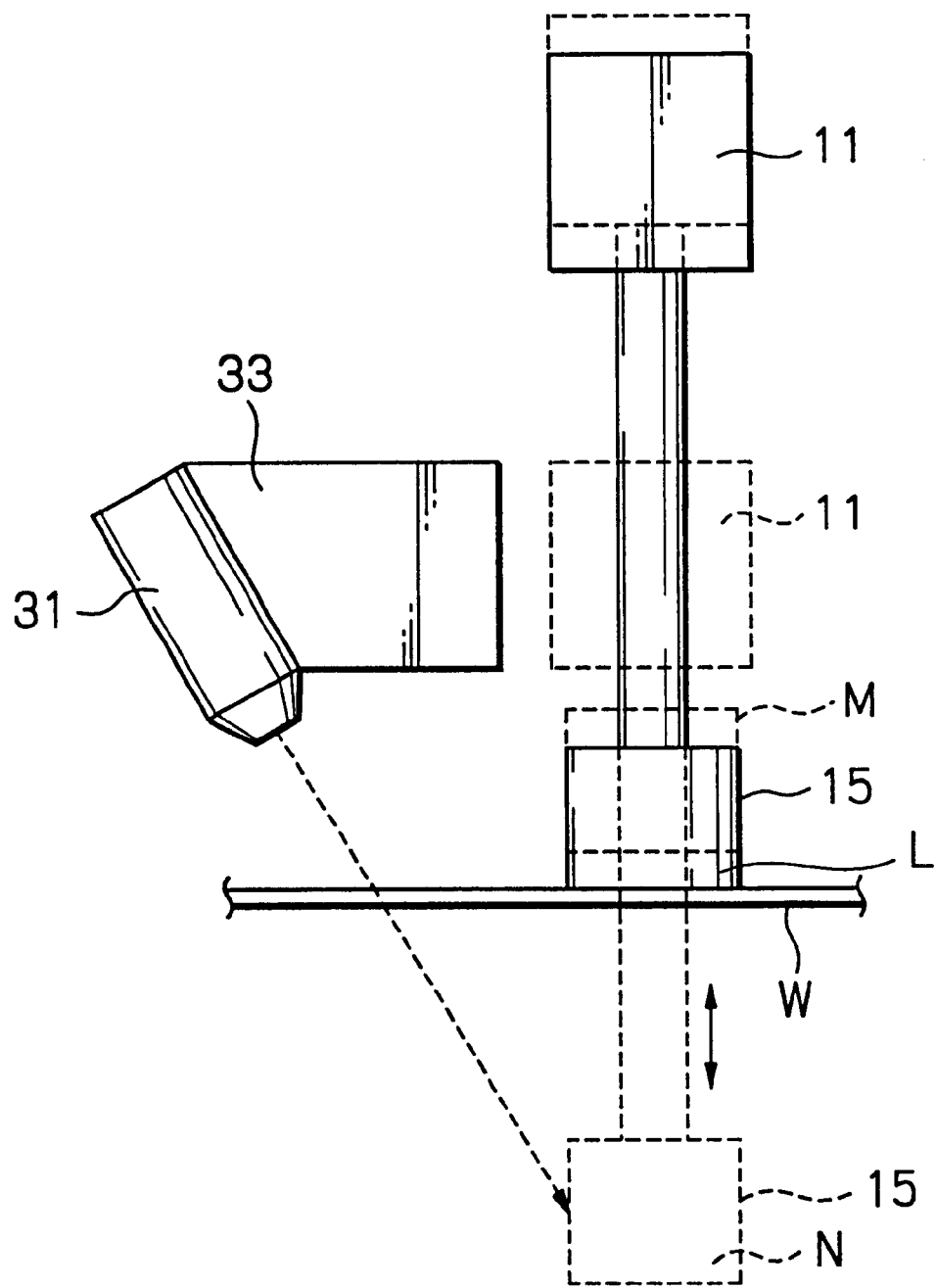
FIG. 3 is an enlarged view of a main portion illustrating a positional relationship of a sponge and a nozzle relative to a semiconductor wafer W.
Figure 4:
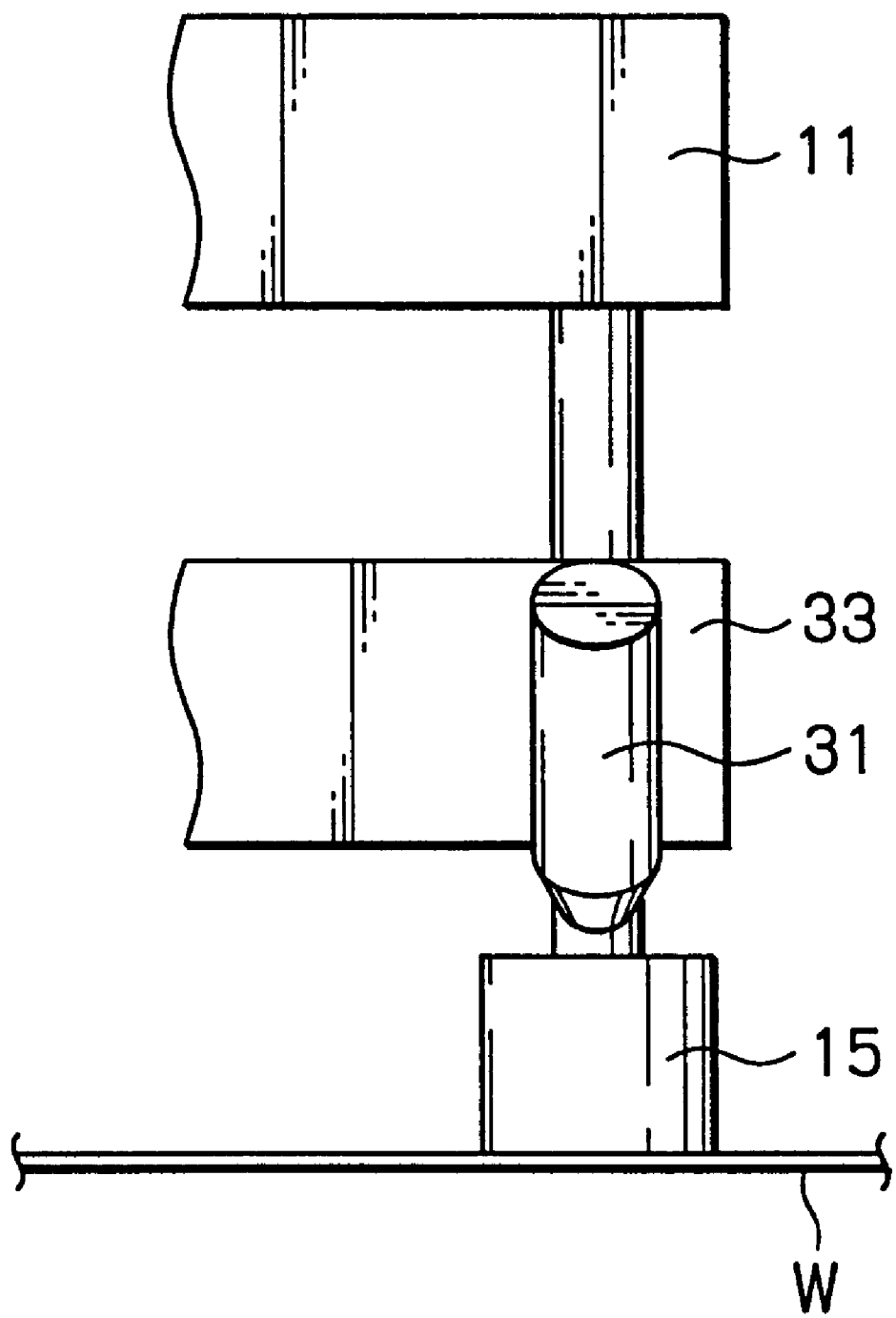
FIG. 4 is another enlarged view as viewed from another direction of the main portion illustrating a positional relationship of the sponge and the nozzle relative to the semiconductor wafer.

FIGS. 3 and 4 are enlarged views of a main portion illustrating a positional relationship of the sponge 15 and the nozzle 31 relative to the semiconductor wafer W during a cleaning operation, wherein FIG. 3 is a view taken along an arrow A of FIG. 1(b) and FIG. 4 is an enlarged schematic view of a main portion taken along an arrow B of FIG. 1(b). As shown in FIG. 3, the arm 11 is configured to be movable upward or downward as a whole so that the sponge 15 may be moved at least to a cleaning position L where the sponge 15 is brought into contact with a surface of the wafer W as shown by the solid line to clean it, a retracted position M where the sponge 15 is set apart from the wafer W, and a self-cleaning position N as shown by the dotted lane where the sponge 15 is moved downward further from the cleaning position L (that is, where the jet-sprayed liquid from the nozzle 31 is directly applied to the sponge 15).

On the other hand, the arm 33 with the nozzle 31 attached thereto is configured to maintain its vertical position without being moved upward or downward so as to direct from which position a jet spray of liquid energized by an ultrasonic wave to the semiconductor wafer W. The angle and distance of the jet spray nozzle 31 relative to the semiconductor wafer W are selected as required to enable ultrasonic energy imparted to the liquid to operate most effectively on dust on the surface of the wafer W. Accordingly, in this embodiment, the arm 33 is not moved upward or downward. Further, in this embodiment, a cleaning portion of the sponge 15 and that of the nozzle 31 are arranged so as to be on one locus line of movement (shown by a chain line in FIG. 1(b)). In addition, the locus of movement of both portions is arranged so that a center of rotation of the semiconductor wafer W occurs on or near the locus of movement.

A cleaning operation may be accomplished effectively by rubbing and scanning the surface of the wafer W driven rotatively by the servo motor 70 with the sponge 15 also being driven rotatively, or by scanning the same with the jet spray of the liquid energized by an ultrasonic wave applied from the nozzle 31 thereto. An example of a cleaning method will be described in detail.

Figure 5:
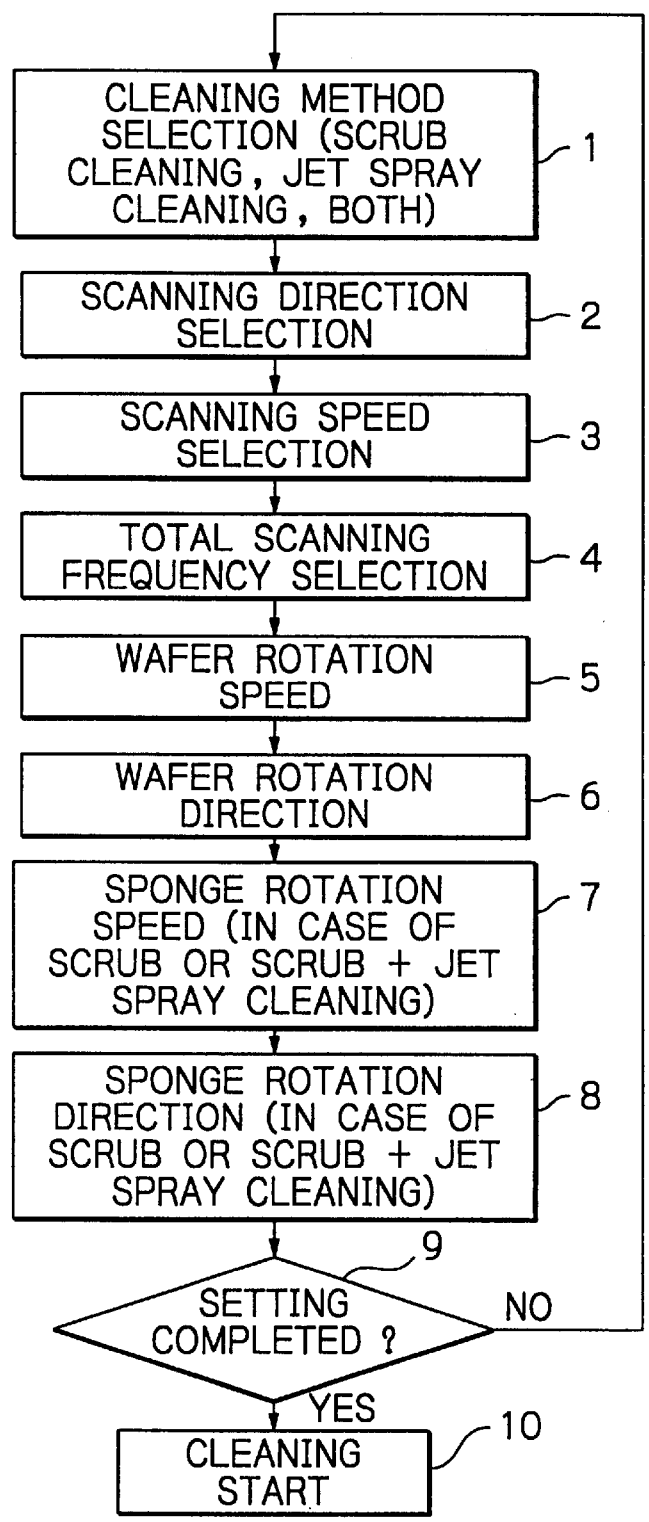
FIG. 5 is a block diagram illustrating a setting procedure for setting a cleaning process.

FIG. 5 is a block diagram illustrating an example of a setting procedure for configuring a cleaning process. First, a cleaning method by this cleaning apparatus is selected (step 1). There are provided three methods, that is, a method employing the scrub cleaning tool 10 only, a method employing the liquid jet spray nozzle 30 only, and a method employing both of the scrub cleaning tool 10 and the liquid jet spray nozzle 30.

Then, a scanning direction, that is, whether the arms 11 and 33 are to be swung from a point "a" to a point "b" in FIG. 1(b) or from a point "b" to a point "a" is selected (step 2). Next, a scanning speed and a total frequency of scanning are selected (steps 3, 4), and a speed and a direction of rotation of the wafer W are selected (steps 5, 6). When the scrub cleaning or the scrub cleaning plus the liquid jet spray cleaning is selected, a speed and a direction of rotation of the sponge are selected (steps 7, 8). After these steps have been completed, cleaning is started (steps 9, 10), but when another successive cleaning method is to be applied, the process returns to step 1 to select the other successive method and to proceed with the selection in the same manner as described above. Some examples of the cleaning condition will be shown as below:

EXAMPLE 1

Cleaning method: liquid jet spray cleaning (ultrasonic spray cleaning)
Scanning direction: "b" to "a"
Scanning speed: 10 mm/sec
Total scanning frequency: 3 times
Rotation speed of the wafer W: 1000 rpm
Rotation direction of the wafer W: clockwise
Cleaning method: scrub cleaning
Scanning direction: "b" to "a"
Scanning speed: 10 mm/sec
Total scanning frequency: 3 times
Rotation speed of the sponge: 60 rpm
Rotation direction of the sponge: clockwise
Rotation speed of the wafer W: 1000 rpm
Rotation direction of the wafer W: clockwise

EXAMPLE 2

Cleaning method: scrub cleaning +liquid jet spray cleaning (ultrasonic spray cleaning)
Scanning direction: "b" to "a"
Scanning speed: 10 mm/sec
Total scanning frequency: 3 times
Rotation speed of the sponge: 60 rpm
Rotation direction of the sponge: clockwise
Rotation speed of the wafer W: 1.000 rpm
Rotation direction of the wafer ,W: clockwise A step for setting a scanning range of the wafer W may be further added to the setting procedure for setting the cleaning process described above. For example, one range may be selected from a group of ranges consisting of a range from periphery to periphery of the wafer W, from a central portion to the periphery thereof, and from an intermediate portion between the periphery and the central portion to the periphery thereof. In addition, any radial position of the wafer may be entered to define the scanning range from that point to the periphery.

Figure 6:
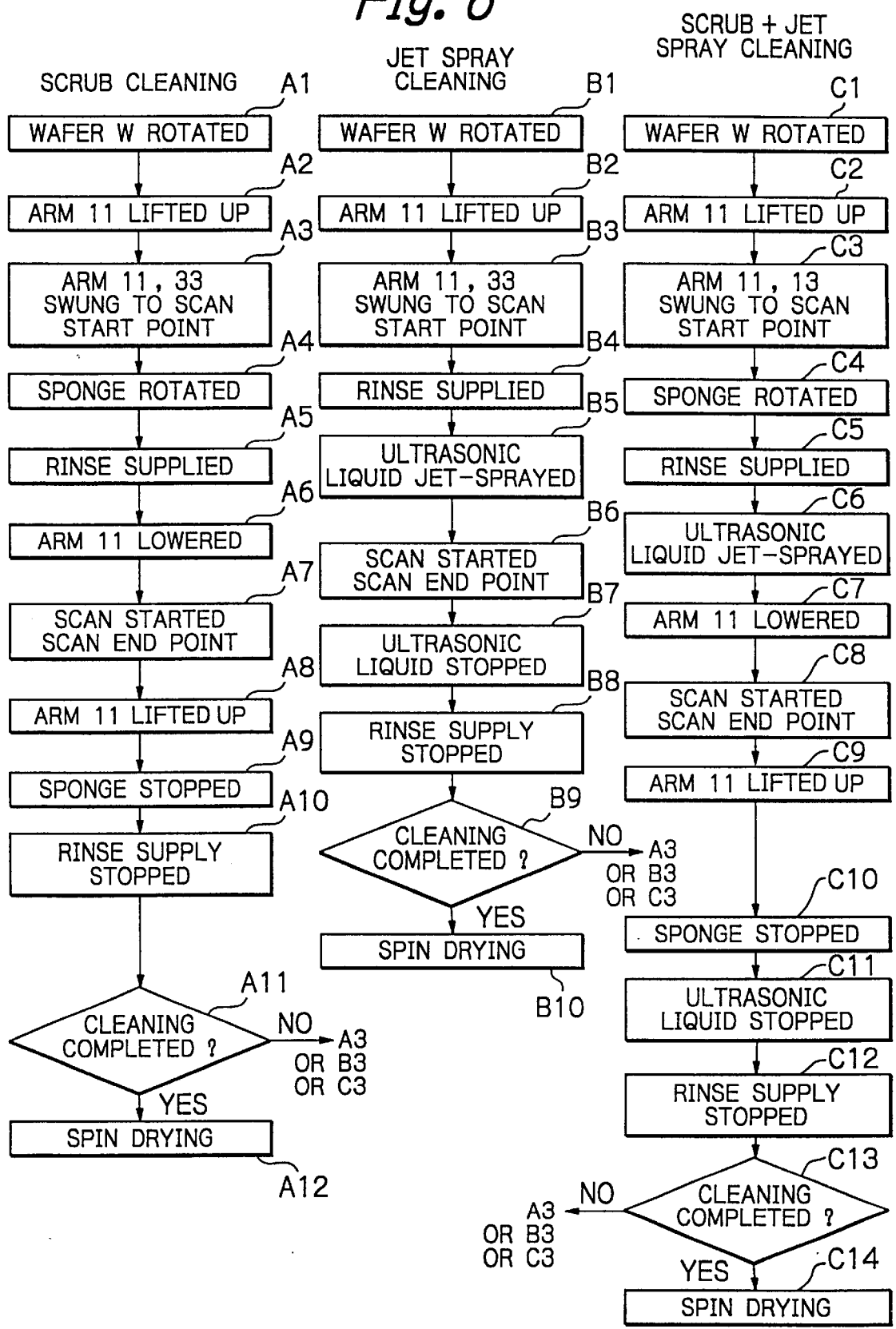
FIG. 6 is a block diagram illustrating cleaning procedures of various cleaning methods.

FIG. 6 is a block diagram illustrating cleaning procedures of respective cleaning methods. For example, when the cleaning condition shown in EXAMPLE 1 described above is employed, the wafer W is rotatively driven at step B1, and then the arm 11 is lifted by actuating the cleaning tool vertical driving mechanism 17 (step B2). Then, the arms 11 and 33 are swung by actuating the swing mechanism 50 to be positioned to a starting point of scanning, that is, the point "b" of FIG. 1(b) (step B3), a rinse supply from the rinse supply means 60 onto the semiconductor wafer W as shown in FIG. 1(a) is started (step B4), simultaneously, a jet spray of liquid excited by ultrasonic vibration energy from the nozzle 31 is started (step B5), and the scanning is started by actuating the swing mechanism 50 while keeping the condition above to swing the arms 11 and 33 to the point "a" of FIG. 1(b) (step B6). Then, the jet spray of the liquid from the nozzle 31 is stopped (step B7), simultaneously, the rinse supply from the rinse supply means 60 is stopped (step B8), and then the process moves from step 89 back to step B3, and the processes between steps B3 and B8 are repeated two more times and then the process moves to step A3.

Then, the arms 11 and 33 are swung by actuating the swing mechanism 50 to be positioned to the starting point of scanning (point "b") (step A3), the sponge 15 is rotated by actuating the sponge rotating motor 13 (step A4), simultaneously, the rinse is supplied from the rinse supply means 60 onto the semiconductor wafer W (step A5), the arm 11 is lowered to a position where the sponge 15 is brought into contact with the surface of the semiconductor wafer W (step A6), then the scanning is started by actuating the swing mechanism 50 while keeping the condition above to swing the arms 11 and 33 to an end point of scanning (point "a") (step A7), the arm 11 is lifted again (step A8), the rotation of the sponge 15 is stopped (step A9), simultaneously, the rinse supply from the rinse supply means 60 is stopped (step A10), then the process returns to step A3 to repeat two more times the processes between steps A3 and A10, and then the wafer W is rotatively driven by actuating the servo motor 70 at high speed to be spin-dried (step A12), and thereby the cleaning process of EXAMPLE 1 is completed.

Further, for example, when the cleaning condition shown in EXAMPLE 2 described above is employed, at first, the wafer W is rotatively driven at step C1, the area 11 is lifted by actuating the cleaning tool vertical driving mechanism 17 (step C2), the arms 11 and 33 are swung by actuating the swing mechanism 50 to be positioned to the starting point of scanning (point "b") (step C3), the sponge 15 is rotatively driven (step C4), simultaneously, a rinse liquid is supplied from the rinse supply means 60 onto the semiconductor wafer W (step C5), the liquid excited by the ultrasonic vibration energy is jet-sprayed from the nozzle 31 (step C6), the arm 11 is lowered to a position where the sponge 15 is brought into contact with the surface of the semiconductor wafer W (step C7), and then the scanning is started by actuating the swing mechanism 50 while keeping the condition above to swing the arms II and 33 to the end point of scanning (point "a") (step. C8). Then, the arm 11 is lifted (step C9), the rotation of the sponge 15 is stopped (step C10), simultaneously, the liquid jet spray from the nozzle 31 and the rinse supply from the rinse supply means 60 are stopped (step C11, C12), then at step C13 the process returns to step C3 to repeat two more times the processes between steps C3 and C12, and then the wafer W is spin-dried (step C14), and thereby the cleaning process 10 of EXAMPLE 2 is completed.

When the scrub cleaning and the liquid jet spray cleaning are conducted simultaneously as in EXAMPLE 2, the cleaning effect by both cleaning methods is brought through one scanning process and accordingly the cleaning is accomplished efficiently and effectively. Further, in this embodiment, since the cleaning portion of the sponge 15 and that of the nozzle 31 are arranged so as to be on one locus line of movement, each portion is cleaned by the scrub cleaning after the ultrasonic spray cleaning when the scanning motion is directed from the point "b" to the point "a", while each portion is cleaned by the ultrasonic spray cleaning after the scrub cleaning when the scanning motion is directed from the point "a" to the point "b". Thus, since either scanning direction may be selected in accordance with a contamination condition of the wafer W, an optimum cleaning may be conducted.

As described above, since in the present embodiment both of the scrub cleaning tool 10 and the liquid jet spray nozzle 30 are mounted on a single swing mechanisms 50, an additional or plurality of swing mechanism 50 is not necessary, which provides not only a simple structure, but also a short cleaning period and high processing efficiency as a result of a simultaneous processing of the scrub cleaning and the liquid jet spray cleaning, and it also provides simpler control in comparison with a case where respective cleaning means are mounted on respective arms.

On the other hand, when both arms 11 and 33 are in their retracted positions of the arms as shown by the dotted line in FIG. 1(b) (or when the sponge 15 is not on the semiconductor wafer W), the arm 11 is lowered by actuating the arm vertical driving motor 173 shown in FIG. 2 until the sponge 15 is moved downward to the position N shown by the dotted line in FIG. 3, and then the sponge 15 is rotated and simultaneously, a liquid energized by the ultrasonic wave is sprayed thereto to effect self-cleaning. Since the sprayed liquid is energized by the ultrasonic wave, an excellent cleaning efficiency can be obtained.

Although, in FIG. 1(b), a point X is selected as the retracted position of the arms, a point Y can also be selected. When the scanning direction is selected to be from "a" to "b", which means that the starting point of scanning is the point "a", the arms are moved to the point X before the wafer W to be cleaned is set on the vacuum chuck mechanism 73. When the scanning direction is selected to be from "b" to "a" which means that the starting point of scanning is the point "b", the arms are moved to the point Y before the wafer W to be cleaned is set on the vacuum chuck mechanism 73. When the endpoint of scanning is the point "b", then the arms are moved to the point Y. When the end point of scanning is the point "a", then the arms are moved to the point X. Before the wafer W is taken out and the next one to be cleaned is set on the vacuum chuck 73, the arms are moved to either of their retracted positions of the arms depending on the starting point of scanning of the next wafer W. In the present invention, since the liquid can be supplied to the sponge in both of X and Y points, problems such as a drying of the sponge or a development of bacteria in stagnant water within the sponge can be avoided in any case of timing of setting or taking out operations of the wafer W. A period required for moving the arms from the retracted position thereof to the starting position of scanning, or from the end point of scanning to the retracted position thereof may also be made short.

Figure 8:
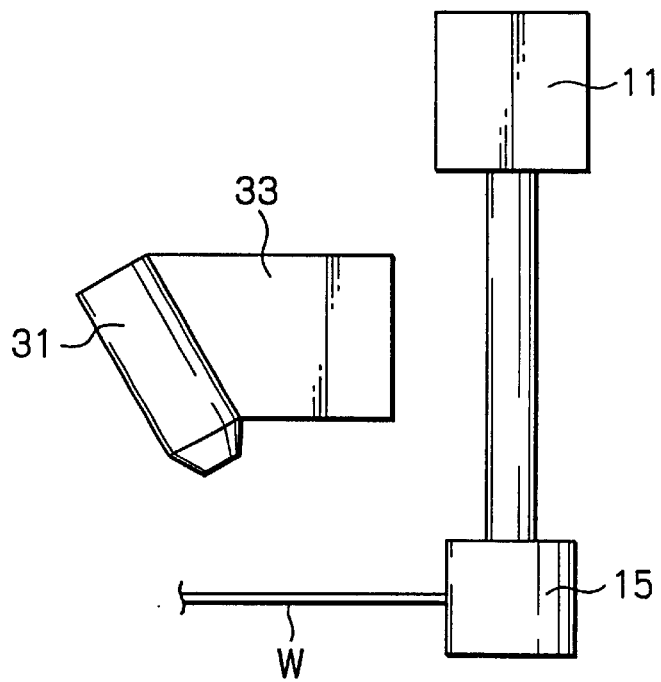
FIG. 8 is a schematic view showing a cleaning operation for cleaning a side surface of the semiconductor wafer by the sponge.

In addition, when the sponge 15 is moved near to the periphery of the wafer W (that is, near to the point "a" or "b") by swinging the arms 11 and 33, and then the arm 11 is lowered by the cleaning tool vertical driving mechanism 17 so that the sponge 15 is located in a position shown in FIG. 8, and a peripheral side surface of the rotating semiconductor wafer W is rubbed with a side surface of the rotating sponge 15, the peripheral side surface of the semiconductor wafer W can be cleaned efficiently. If this cleaning process is conducted when the sponge 15 is at the point "a" or "b" immediately before or after the scanning operation of the semiconductor W, both of the top surface and the side surface of the semiconductor wafer W can be cleaned in a single scanning process, which is preferable.

Figure 9:
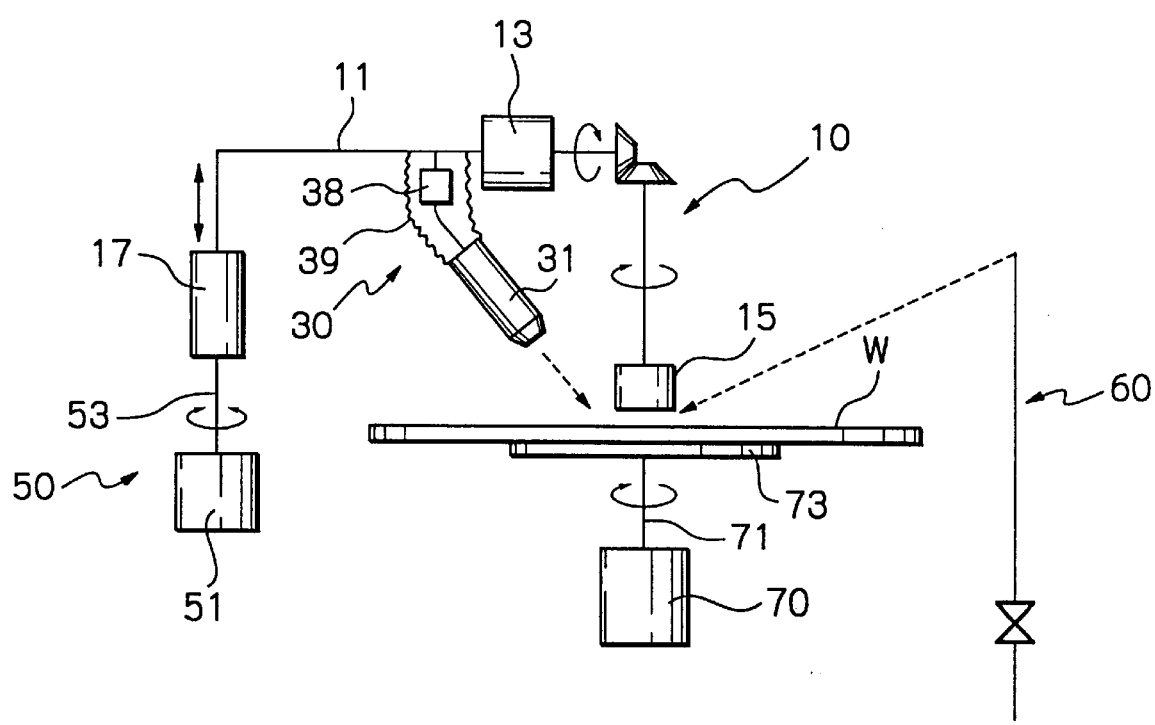
FIG. 9 is a schematic diagram of a substrate cleaning apparatus according to a second embodiment of the present invention.

FIG. 9 is a schematic diagram of a substrate cleaning apparatus according to a second embodiment of the present invention. In this embodiment, what is different from the first embodiment is that the arm 33 of the liquid jet spray nozzle 30 is removed and the nozzle 31 is mounted on the arm 11 of the scrub cleaning tool 10 via a nozzle vertical driving mechanism 38. For example, an air cylinder may be employed as the nozzle vertical driving mechanism 38.

This configuration makes the overall structure simpler since both of the scrub cleaning tool 10 and the liquid jet spray nozzle 30 can be mounted on the single arm 11. In this embodiment also, as in the first embodiment, any of three cleaning methods may be selected, that is, the method for using only the scrub cleaning tool 10, that for using only the liquid jet spray nozzle 30, and that for using both of the scrub cleaning tool 10 and the liquid jet spray nozzle 30.

Although the nozzle 31 is moved vertically as the scrub cleaning tool 10 is moved vertically by the cleaning tool vertical driving mechanism 17, the nozzle 31 can be moved vertically by actuating the nozzle vertical driving mechanism 38, so that an optimal cleaning position (that is, an optimal distance from the wafer W) can always be selected. An optimal jet spray angle of the nozzle is adjusted by an jet spray angle adjusting means for the 5 nozzle (not illustrated).

In this embodiment, the nozzle vertical driving mechanism 38 is enclosed with a bellows cover member 39, which can serve well as a dustproof means against the nozzle vertical driving mechanism 38 which is a movable section, and thereby, the semiconductor wafer W can be prevented from being contaminated.

In this embodiment, since the cleaning portion of the sponge 15 and that of the nozzle 31 are arranged so as to be on one locus line of movement as in the first embodiment, each portion of the wafer W may be cleaned by the scrub cleaning after the ultrasonic spray cleaning, or also may be cleaned by the ultrasonic spray cleaning after the scrub cleaning. Thus, either scanning direction may be selected in accordance with a contamination condition of the wafer W so that an optimum cleaning may be conducted.

In this embodiment, the peripheral side surface of the semiconductor wafer W can be cleaned by the sponge 15 by lowering the sponge 15 at a position near to a periphery of the semiconductor W, and the self-cleaning of the sponge 15 by the nozzle 31 can be conducted by selecting an lifted-up position of the nozzle 31 such that a cleaning liquid jet-sprayed from the nozzle 31 in the lifted-up position is directed to the cleaning tool or the sponge 15.

Figure 7B:
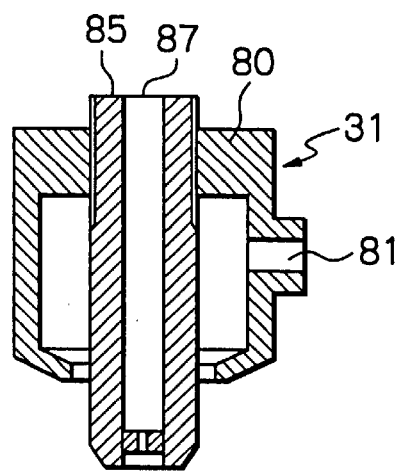

The preferred embodiments of the present invention have been described in detail, but it is to be understood that the present invention is not limited to those embodiments above, but various changes and modifications may be applied thereto as shown below. For example, though in each of the above embodiments, the ultrasonic spray nozzle is employed as the liquid jet spray nozzle 30, other types of liquid jet spray nozzles such as a cavitation cleaning nozzle or a high pressure water nozzle may be employed. In the cavitation cleaning nozzle, the nozzle 31 comprises a low pressure nozzle 80 and a high pressure nozzle 85 as shown in FIG. 7(b), wherein a low pressure liquid (ultrapure water) is introduced into an inlet port 81 of the low pressure nozzle 80 and simultaneously a high pressure cleaning liquid (ultrapure water) is introduced into an inlet port 87 of the high pressure nozzle 85, and a jet with cavitation generated on a boundary of a low pressure jet and a high pressure jet by a velocity difference therebetween is sprayed against the semiconductor wafer W. When the surface of the wafer W is located in a position where the cavitation is crashed (optimum position), energy of the cavitation is applied to the dust on the wafer W to remove it efficiently. The high pressure water nozzle described above is configured to jet the high pressure liquid (ultrapure water) from a nozzle.

Figure 10A:
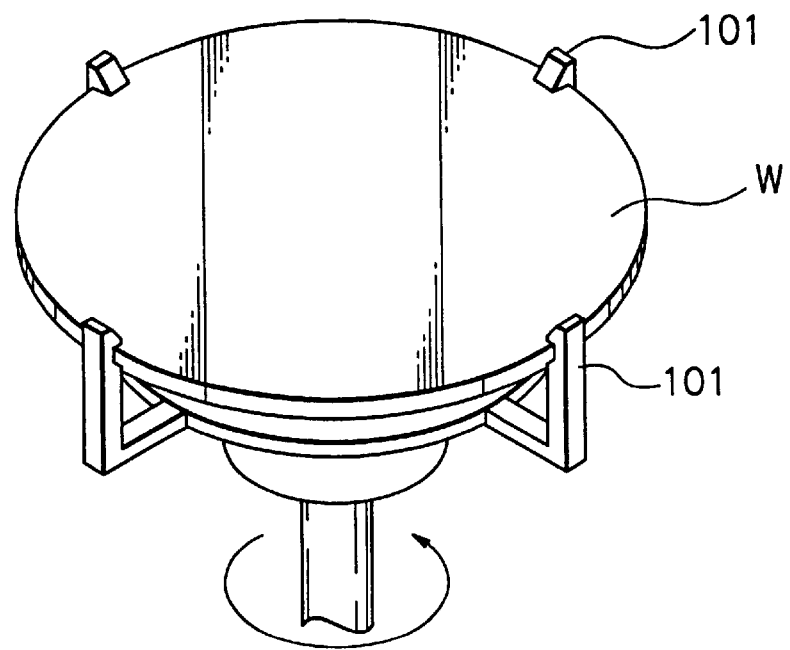
FIGS. 10(a) and 10(b) are perspective views of other holding and rotating mechanisms of the semiconductor wafer.
Figure 10B:
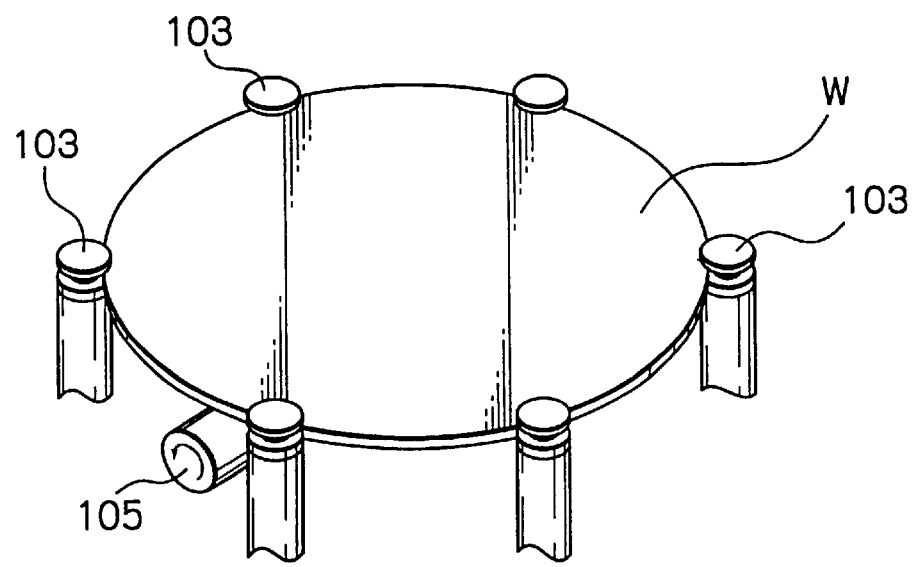

As a holding and rotating mechanism of the semiconductor wafer W, various types of holding and rotating mechanisms other than the vacuum chuck mechanism 73 may be employed, such as a catch chuck mechanism for chucking the periphery of the semiconductor wafer W by a plurality of catches 101 to rotate the semiconductor wafer W as shown in FIG. 10(a), and a roller chuck mechanism for chucking the periphery of the semiconductor wafer W by a plurality of rotatable rollers 103 to rotate the semiconductor wafer W as shown in FIG. 10(b) (the semiconductor wafer W can be rotated by rotatively driving at least one of the rollers 103). In the case where the rollers 103 are employed, a back surface of the semiconductor wafer W can be cleaned simultaneously by a cleaning tool 105 comprising a cylindrical sponge (brush).

Figure 11:
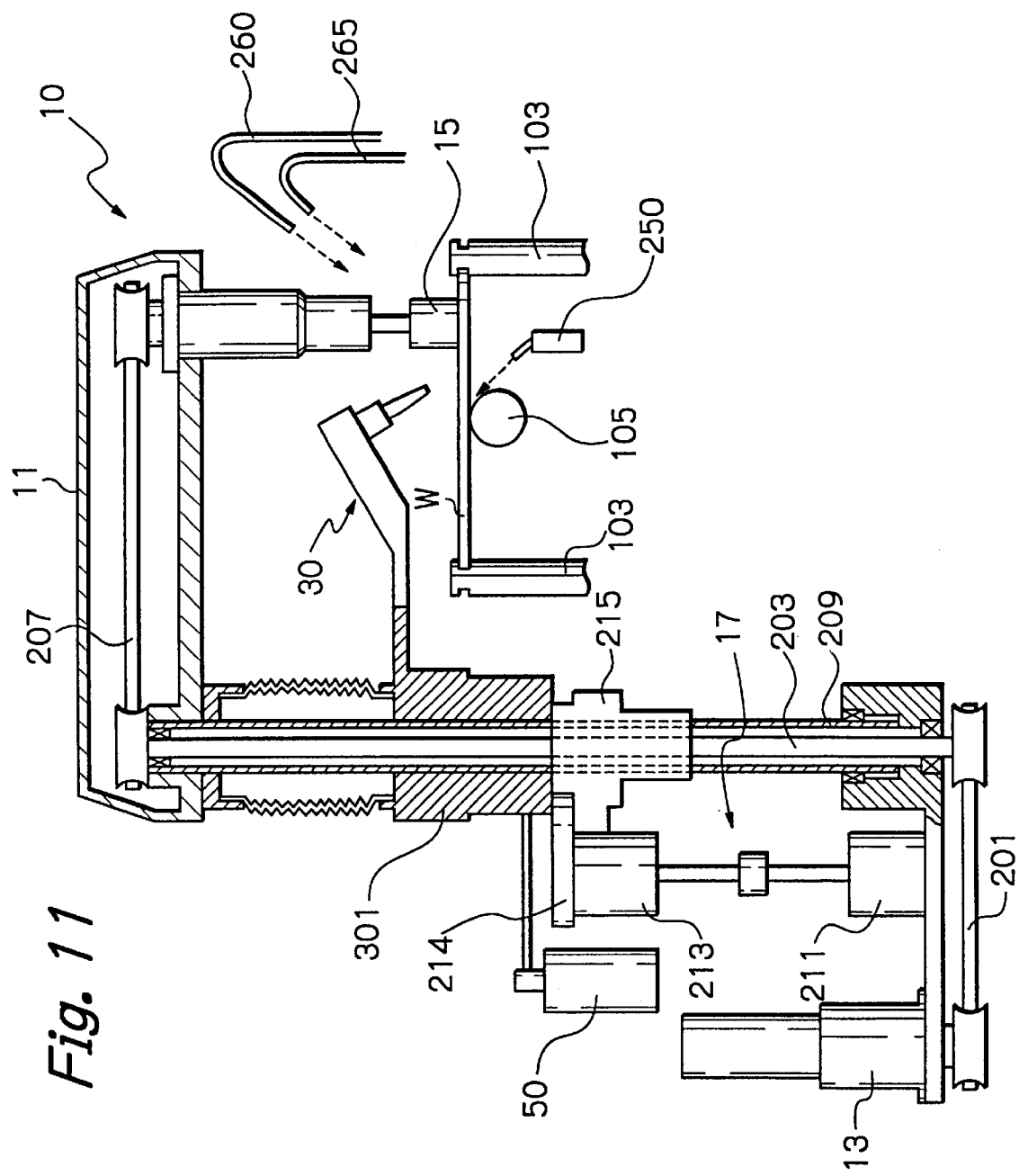
FIG. 11 is an overall schematic diagram illustrating another embodiment of the present invention.

As the cleaning tool vertical driving mechanism and the swing mechanism of the scrub cleaning tool 10 and the liquid jet spray nozzle 30, various types of devices may be employed including that shown in FIG. 11.

That is, FIG. 11 is an overall schematic diagram illustrating another embodiment. In the substrate cleaning apparatus shown in FIG. 11, the scrub cleaning tool 10 is configured such that power of the sponge rotating motor 13 is transmitted to the sponge 15 through a belt drive mechanism 201, a shaft 203 and a belt drive mechanism 207.

The cleaning tool vertical driving mechanism 17 comprises two cylinders 211 and 213, and a ball bush 215 connected to the upper cylinder 213. The upper cylinder 213 and the ball bush 215 are secured stationarily in their positions by the fixing member 214. An outer tube 209 of the shaft 203 is rotatably supported in the ball bush 215 so as to be movable along a vertical direction. The liquid jet spray nozzle 30 has a base portion 301 which rotates together with the tube 209 but does not follow a vertical movement thereof. The swing mechanism 50 is attached to the base portion 301 to rotatively drive it.

When the sponge rotating motor 13 is driven, the sponge 15 is rotatively driven. When the cylinders 211 and 213 are actuated, since the upper cylinder 213 and the ball bush 215 are stationarily secured, the sponge rotating motor 13, the shaft 203, the tube 209, the arm 11 and the like are as a whole moved upward or downward, and the whole of the scrub cleaning tool 10 is moved upward or downward. At this time, the liquid jet spray nozzle 30 is left in its original position. When the base portion 301 is rotated or swung by the swing mechanism 50, the scrub cleaning tool 10 and the liquid jet spray nozzle 30 are simultaneously swung since the tube 209 is rotated together with the base portion 301.

When the cylinders 211, 213 and the ball bush 215 are employed as the cleaning tool vertical driving mechanism 17 as in this embodiment (since, in fact, strict control of the vertical movement as of the ball screw is not required), the motor is not necessary and three vertical positions can also be selected by applying an on/off control of a pressure to the two cylinders 211, 213, respectively. Three positions correspond to three operating positions including a non-cleaning (upper) position, a cleaning (middle) position and a bevel (periphery) cleaning (lower) position (or self-cleaning position).

In this embodiment, the periphery of the wafer W is supported by the rollers 103 as shown in FIG. 10(b) and the cleaning tool 105 comprising the roll sponge is provided on the under side of the wafer W to clean it. The reason why the wafer W is supported by the rollers 103 is that this type of cleaning apparatus is used in primary cleaning and accordingly, dust and a metal ion attached to the rear surface of the wafer W are required to be removed. That is, a wafer support mechanism which allows cleaning of both surfaces and also edge side cleaning is required. A number of outlets are formed on an outer surface of the cylindrical roll sponge 105 so that the cleaning liquid (e.g. pure water for scrub cleaning) flows from an inside of the cylinder of the roll sponge 105 to an outer surface thereof.

Above, the wafer W is provided a chemical liquid nozzle 260 for jet-spraying a chemical liquid (e.g. hydrofluoric acid) and a pure water nozzle 265 for jet-spraying pure water, respectively.

Figure 12:
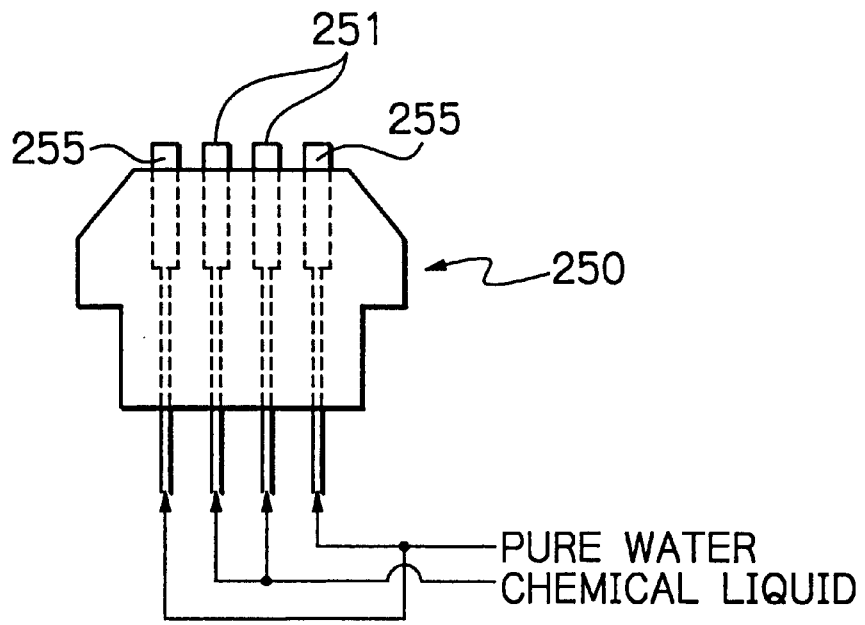
FIG. 12 is a schematic view showing a cleaning liquid nozzle.

Next, on the roll sponge 105 on the under side of the wafer W, a cleaning liquid nozzle 250 is also installed. As shown in FIG. 12, the cleaning liquid nozzle 250 is provided with two inside chemical liquid nozzles 251 for jet-spraying a chemical liquid (e.g. hydrofluoric acid) onto the rear surface of the wafer W and two outside pure water nozzles 255 for replacing the chemical liquid used for chemical liquid cleaning with jet-spraying pure water, respectively.

Figure 13:
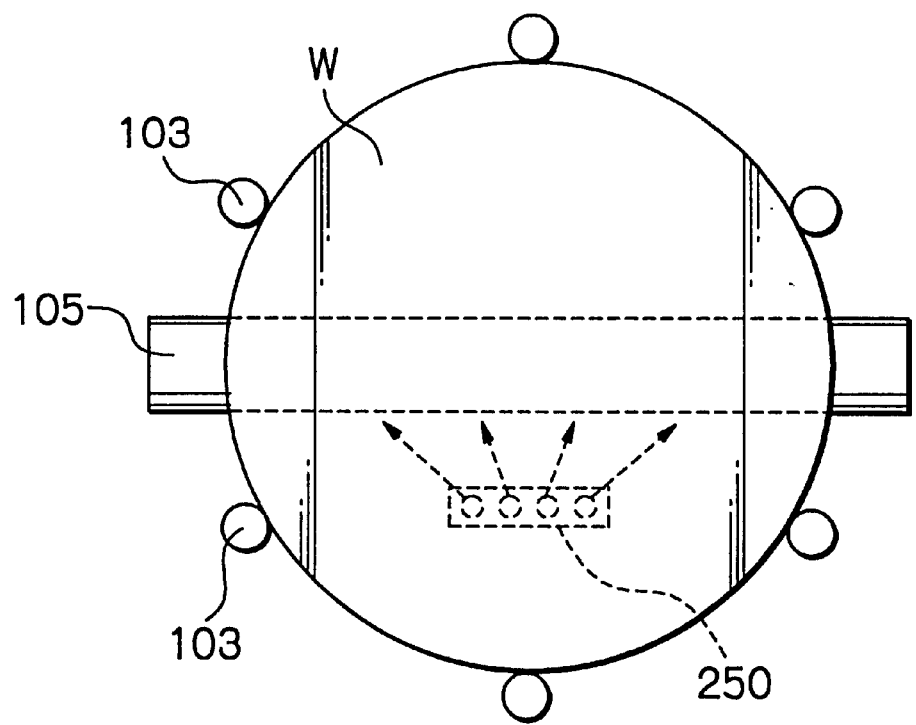
FIG. 13 is a plan view illustrating an arrangement of a roll sponge and the cleaning liquid nozzle.
Figure 14:
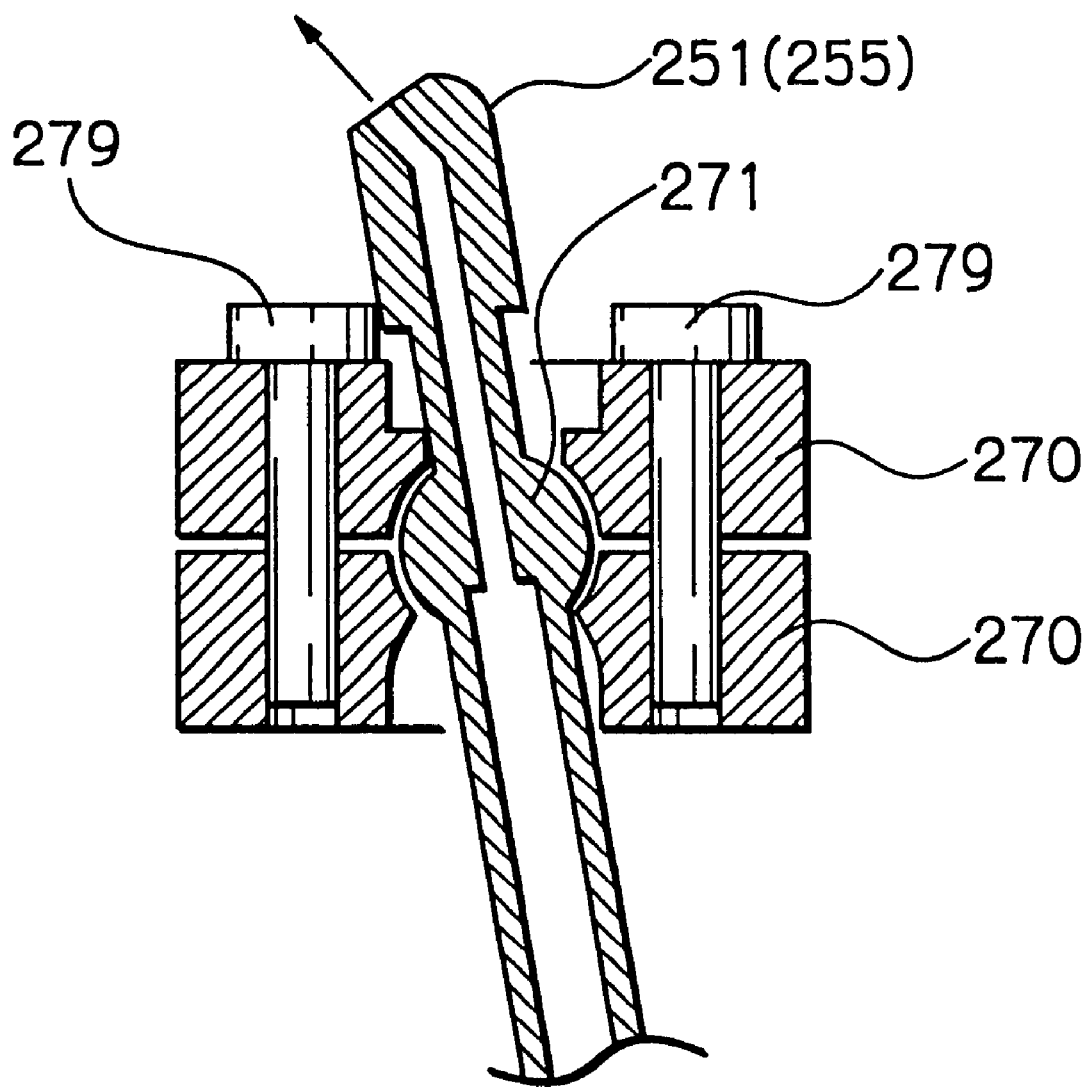
FIG. 14 is a schematic cross sectional view of a main part of a nozzle of the cleaning liquid nozzle.

As shown in FIG. 13, the cleaning liquid nozzle 250 is disposed on a side of the roll sponge 105 to jet-spray the cleaning liquid obliquely against the wafer W from its position. Accordingly, each nozzle 251 (255) is configured so as to be directed to and fixed to an appropriate angle with respect to an upper and a lower nozzle fixing plates 270, 270 as shown in FIG. 14, which is a schematic cross sectional view of a main part thereof. That is, the nozzle 251 (255) is configured such that a spherical seat 271 formed thereon is sandwiched by the upper and the lower nozzle fixing plates 270, 270, and, after being set at a specified angle (swingable throughout 360 degrees), the nozzle 251 (255) is fixed by fastening screws 279, 279.

A cleaning process using such a configuration as described above is conducted, for example, as follows. At first, in order to apply the scrub cleaning for removing particles on the wafer W, the upper surface of the wafer W is cleaned by the sponge 15 and the pure water nozzle 265, or by the sponge 15, the liquid jet spray nozzle 30 and the pure water nozzle 265, and simultaneously, the rear surface of the wafer W is cleaned by the roll sponge 105 and the cleaning liquid (pure water) flowing out of the roll sponge 105.

Then, in order to apply the chemical liquid cleaning for removing metal ions, the sponge 15 is lifted by actuating the cylinders 211, 213, and the roll sponge 105 is lowered to set it apart from the wafer W by a driving means, not shown, and then the chemical liquid is jet-sprayed from the upper and the lower chemical liquid nozzles 260,251. At that time, ultrasonic spray cleaning may be applied by the liquid jet spray nozzle 30. A combination of the chemical liquid cleaning, the scrub cleaning and the liquid jet spray cleaning may be varied depending on a kind of film on the wafer W.

Then pure water is jet-sprayed from the upper and the lower pure water nozzles 265, 255 in order to make a pure water replacement on the upper and the rear surfaces of the wafer W.

As described above, in accordance with this cleaning apparatus, a series of cleaning operations consisting of the scrub cleaning plus the liquid jet spray cleaning (ultrasonic cleaning), the chemical liquid cleaning, and the pure water replacement in this order can be conducted in a single cleaning apparatus. Following processing is only the spin drying on the other unit.

Though the examples for cleaning the semiconductor wafer W as a substrate are described in each of the above embodiments, these may be applied to clean other various substrates such as LCDs or the like.

Next, a chemical mechanical polishing apparatus (CMP apparatus) having a cleaning section configured using the substrate cleaning apparatus according to the present invention will be described.

FIG. 15 is an overall schematic plan view illustrating an example of an arrangement of this kind of polishing apparatus. As shown in FIG. 15, this polishing apparatus includes two polishing machines 310 (310a, 310b), each having the same configuration and being disposed symmetrically in a left side and a right side. A cleaning section 326 includes two primary cleaning machines 326a1, 326a2, two secondary cleaning machines 326b1, 326b2 and two inverting machine 328a1, 328a2, each corresponding to the polishing machines 310a or 310b and being disposed symmetrically in a left side and a right side, respectively, and also includes two conveying machines 324a, 324b. Two loading/unloading sections 322,322 are also disposed symmetrically in a left side and a right side, respectively.

The polishing machine 311a, 310b comprises a polishing table 312a, 312b with a cloth (polishing cloth) attached on a top surface thereof, and a top ring 313a, 313b for holding a semiconductor wafer onto an under surface thereof and pushing the wafer onto the polishing table 312a, 312b to polish it.

In the polishing apparatus having a configuration described above, the wafer is moved from the loading/unloading section 322 (or 322) onto the polishing table 312a (or 312b) by using the conveying machines 324a, 324b through a delivery table 338a (or 338b) and by being vacuum-chucked onto the under surface of the top ring 313a (or 313b). A polishing tool having a polishing surface, such as a polishing pad or a grinding wheel, is attached onto the top surface of the polishing table 312a, 312b. Herein, each of the polishing table 312a (or 312b) and the top ring 313a (or 313b) is rotated and the wafer is pushed onto the polishing surface to be polished while supplying a specified slurry (in case of polishing an insulating layer (oxide film) on a Si wafer, an alkaline aqueous solution including a specified size of polishing powder suspending therein). After being polished, the wafer is returned to the loading/unloading section 322 through a cleaning and drying process.

The primary cleaning machine 326a1, 326a2 employs the substrate cleaning apparatus according to the present invention, in which a plurality of vertical rollers 330 are disposed surrounding the wafer to hold an outer edge of the wafer by a groove formed on an upper circumference of the roller 330 so that the wafer is cleaned by the above method while rotating the roller 330 and thereby rotating the wafer. The secondary cleaning machine 326b1, 326b2 is a high-speed rotary type cleaning machine having arms extending radially from a top end of a rotary shaft for clamping the wafer (such as a catch chuck mechanism shown in FIG. 10(a)).

A cleaning process following the wafer polishing process described above is conducted as detailed below. At first, the cleaning is conducted in the primary cleaning machine 326a1 (or 326x2) while rotating the wafer according to the above method.

Then, the wafer is cleaned in the secondary cleaning machine 326b1 (or 326b2), and, after that, is rotated at a high-speed to conduct a drying process. After having finished the cleaning/drying process, the wafer is returned to the loading/unloading section 322 by a clean hand of the conveying machine 324b.

In this polishing apparatus, two operation methods may be employed, one being a parallel operation method in which each wafer is individually polished in either of two polishing machines 310x, 310b, and the other being a serial operation method in which each wafer is conveyed through both polishing machines 310x, 310b in order for different processes to be applied to each wafer, respectively.

In the parallel operation method, each of a normal polishing using abrasives and a water polishing using only water without any abrasive is conducted alternately in each of the polishing machines 310x, 310b, placing a time lag therebetween so that the conveying machines 324x, 324b may efficiently convey the wafers. Since this polishing apparatus comprises two polishing machines 310x, 310b, two primary cleaning machines 326x1, 326x2, and two secondary cleaning machines 326b1, 326b2, two wafer processing lines may be constructed. That is, one is a first wafer processing line In which are conducted the polishing process by the polishing machine 310a, the primary cleaning process by the primary cleaning machine 326a1, and the secondary cleaning process by the secondary cleaning machine 326b1 in this order. The other one is a second wafer processing line in which are conducted the polishing process by the polishing machine 310b, the primary cleaning process by the primary cleaning machine 326a2, and the secondary cleaning process by the secondary cleaning machine 326b2 in this order. Therefore, two wafer processing lines may be independently operated in parallel with each other without any intersection of wafer conveying lines to improve operation efficiency.

In this polishing apparatus, there are also two methods in the parallel operation method. In a first method, each wafer taken out of one cassette of the loading/unloading section 322 is distributed in turn to either of the polishing machines 310a, 310b. In this method, a processing time for one cassette may be decreased by half. In the second method, one cassette is exclusively used for one wafer processing line and another cassette is exclusively used for the other wafer processing line. At that time, the wafer of the one line may be identical with or different from that of the other line. In addition, a continuous processing will be made possible when four cassettes are mountable.

In the serial operation method, the normal polishing is applied to the wafer in one polishing machine 310a and then the wafer is conveyed to the other polishing machine 310b to apply the water polishing thereto. If there is no fear of contamination on the polishing machine, the wafer may be directly conveyed from the one polishing machine 310a to the other polishing machine 310b with the conveying machine 324a. When there is a fear of contamination, after the normal polishing has been applied to the wafer by the one polishing machine 310a, the wafer is conveyed by the conveying machine 324a to the primary cleaning machine 326a1 to be cleaned, and then the wafer is conveyed to the other polishing machine 310b to apply the water polishing thereto. Further, in the primary cleaning machine 326a1., the wafer may be cleaned while adding a preferred chemical liquid in response to the kind of slurry used in the one polishing machine 310a. In this serial operation method, since the normal polishing and the water polishing are conducted on different polishing tables 312x, 312b respectively, the polishing liquid or pure water on respective polishing tables are not required to be switched every time with each other, and accordingly, a loss time in the process and an increased consumption of polishing liquid and pure water can be avoided.

As has been described in detail, the present invention provides many advantageous effects as follows.

1) Since the present cleaning apparatus includes both a scrub cleaning tool and liquid jet spray nozzle and allows selective use of these tool and nozzle as needed, a cleaning period required clean with both of the cleaning tool and nozzle may be reduced thereby improving processing efficiency, and also the structure and control of this apparatus can be made simple.

2) The self-cleaning operation can be easily conducted without any additional equipment for self-cleaning, and this enables the apparatus to be made compact and improves processing efficiency.

3) The peripheral side surface of the substrate can be easily cleaned.

What is claimed is:

1. A substrate cleaning apparatus for cleaning a rotating substrate having a top surface and a peripheral edge, said substrate cleaning apparatus comprising:
   a chuck mechanism for chucking the substrate for supporting and rotating the substrate;
   a scrub cleaning tool for cleaning the substrate by being brought into contact with the substrate;
   a liquid spray nozzle for cleaning the substrate by spraying a cleaning liquid to the substrate;
   a swing mechanism for simultaneously swinging both of said scrub cleaning tool and said liquid spray nozzle to and above the substrate;
   an arm connected to said liquid spray nozzle and said swing mechanism for fixing a vertical position of said liquid spray nozzle; and
   a cleaning tool vertical driving mechanism for moving said scrub cleaning tool to at least three positions where said scrub cleaning tool is in contact with the top surface of the substrate, said scrub cleaning tool is apart from the substrate, and said scrub cleaning tool is sprayed by the cleaning liquid from said liquid spray nozzle for cleaning said scrub cleaning tool, by vertically moving said scrub cleaning tool.

2. A substrate cleaning apparatus claimed in claim 1, wherein said liquid spray nozzle comprises one of an ultrasonic cleaning nozzle for jet-spraying a liquid energized by an ultrasonic wave, a cavitation cleaning nozzle for jet-spraying a liquid energized by an ultrasonic wave, a cavitation cleaning nozzle for jet-spraying a liquid energized by cavitation, and a nozzle for jet-spraying a high pressure water.

3. A substrate cleaning apparatus claimed in claim 1, wherein a cleaning portion of said scrub cleaning tool and said liquid spray nozzle are arranged so as to move along a single locus.

4. A substrate cleaning apparatus claimed in claim 1, wherein said scrub cleaning tool includes a second arm, one end of said second arm being attached to said swing mechanism through said cleaning tool vertical driving mechanism.

5. A substrate cleaning apparatus claimed in claim 4, wherein said scrub cleaning tool comprises a sponge attached to another end of said second arm and is rotatively driven by a rotating motor.

6. A substrate cleaning apparatus claimed in claim 4, wherein said cleaning tool vertical driving mechanism comprises a rotary shaft rotatably supported on said swing mechanism, and a ball screw mounted on said rotary shaft, wherein said second arm is fixedly attached to said ball screw.

7. A substrate cleaning apparatus claimed in claim 1, wherein said chuck mechanism comprises one of a vacuum chuck mechanism, a catch chuck mechanism having a plurality of catches for chucking the periphery of the substrate, and a roller chuck mechanism having a plurality of rotatable rollers for chucking the periphery of the substrate, to support the substrate during cleaning.

8. A substrate cleaning apparatus claimed in claim 7, wherein the substrate is supported by said roller chuck mechanism and a rear surface of the substrate is cleaned simultaneously with a cleaning tool upon cleaning by said scrub cleaning tool or said scrub cleaning tool and said liquid spray nozzle.

9. A polishing apparatus comprising:
   a polishing machine for polishing a substrate by bringing a surface of the substrate to be polished into contact with a polishing surface of a polishing tool; and
   a cleaning machine for cleaning the substrate after the substrate has been polished by said polishing machine, said cleaning machine comprising a substrate cleaning apparatus described in claim 1.

10. A substrate cleaning apparatus claimed in claim 1, wherein said scrub cleaning tool has a bottom surface for cleaning the top surface of the substrate and a side surface for cleaning the peripheral edge of the substrate.

11. A substrate cleaning apparatus for cleaning a rotating substrate having a top surface and a peripheral edge, said substrate cleaning apparatus comprising:
   a chuck mechanism for chucking the substrate for supporting and rotating the substrate;

a scrub cleaning tool for cleaning the substrate by being brought into contact with the substrate? wherein said scrub cleaning tool has a bottom surface for cleaning the top surface of the substrate and a side surface for cleaning the peripheral edge of the substrate;

a swing mechanism for swinging said scrub cleaning tool on the substrate; and a cleaning tool vertical driving mechanism for moving said scrub cleaning tool,from a position where said scrub cleaning tool is in contact with the top surface of the substrate to another position where said scrub cleaning tool is in contact with the peripheral edge of the substrate, by vertically moving said scrub cleaning tool.

12. A substrate cleaning apparatus claimed in claim 11, wherein said scrub cleaning tool includes an arm, one end of said arm being attached to said swing mechanism through said cleaning tool vertical driving mechanism.

13. A substrate cleaning apparatus claimed in claim 11, wherein said scrub cleaning tool includes an arm, one end of said arm being attached to said swing mechanism through said cleaning tool vertical driving mechanism, and said substrate cleaning apparatus further comprising a liquid spray nozzle for cleaning the substrate by spraying a cleaning liquid to the substrate mounted on said arm of said scrub cleaning tool via a nozzle vertical driving mechanism.

14. A substrate cleaning apparatus claimed in claim 11, wherein said chuck mechanism comprises one of a vacuum chuck mechanism, a catch chuck mechanism having a plurality of catches for chucking the periphery of the substrate, and a roller chuck mechanism having a plurality of rotatable rollers for chucking the periphery of the substrate, to support the substrate during cleaning.

15. A substrate cleaning apparatus for cleaning a rotating substrate having a top surface and a peripheral edge, said substrate cleaning apparatus comprising:

a chuck mechanism for chucking the substrate for supporting and rotating the substrate;

a scrub cleaning tool for cleaning the substrate by being brought into contact with the substrate;

a liquid spray nozzle for cleaning the substrate by spraying a cleaning liquid to the substrate;

a swing mechanism for simultaneously swinging both of said scrub cleaning tool and said liquid spray nozzle to and above the substrate; and a cleaning tool vertical driving mechanism for moving said scrub cleaning tool to at least three positions where said scrub cleaning tool is in contact with the top surface of the substrate, said scrub cleaning tool is apart from the substrate, and said scrub cleaning tool is sprayed by the cleaning liquid from said liquid spray nozzle for cleaning said scrub cleaning tool, by vertically moving said scrub cleaning tool.

16. A substrate cleaning apparatus claimed in claim 15, wherein said scrub cleaning tool includes an arm, one end of said arm being attached to said swing mechanism through said cleaning tool vertical driving mechanism, and said liquid spray nozzle is mounted on said arm of said scrub cleaning tool via a nozzle vertical driving mechanism.

17. A substrate cleaning apparatus claimed in claim 15, wherein said liquid spray nozzle comprises an angle adjusting mechanism for adjusting a spray nozzle angle of said liquid spray nozzle to a cleaning position of said scrub cleaning tool.

18. A substrate cleaning apparatus claimed in claim 15, wherein said liquid spray nozzle comprises an angle adjusting mechanism for adjusting a spray nozzle angle of said liquid spray nozzle to a cleaning position of said scrub cleaning tool.

19. A substrate cleaning apparatus claimed in claim 15, wherein said scrub cleaning tool has a bottom surface for cleaning the top surface of the substrate and a side surface for cleaning the peripheral edge of the substrate.

20. A substrate cleaning apparatus claimed in claim 15, wherein said chuck mechanism chucks the peripheral edge of the substrate for supporting and rotating the substrate.

\* \* \* \* \*